(12) United States Patent
Merienne

(10) Patent No.: US 9,637,010 B2
(45) Date of Patent: *May 2, 2017

(54) SYSTEM AND METHOD FOR SECURE CHARGING OF A MOTOR VEHICLE BATTERY

(71) Applicant: RENAULT s.a.s., Boulogne-billancourt (FR)

(72) Inventor: Ludovic Merienne, Gif sur Yvette (FR)

(73) Assignee: RENAULT s.a.s., Boulogne-billancourt (FR)

( * ) Notice: Subject to any disclaimer, the term of this patent is extended or adjusted under 35 U.S.C. 154(b) by 183 days.

This patent is subject to a terminal disclaimer.

(21) Appl. No.: 14/401,436

(22) PCT Filed: May 16, 2013

(86) PCT No.: PCT/FR2013/051065
§ 371 (c)(1),
(2) Date: Nov. 14, 2014

(87) PCT Pub. No.: WO2013/171431
PCT Pub. Date: Nov. 21, 2013

(65) Prior Publication Data
US 2015/0077055 A1    Mar. 19, 2015

Related U.S. Application Data

(60) Provisional application No. 61/657,215, filed on Jun. 8, 2012.

(30) Foreign Application Priority Data

May 16, 2012  (FR) ..................................... 12 54514

(51) Int. Cl.
*H02J 7/00* (2006.01)
*B60L 11/18* (2006.01)
(Continued)

(52) U.S. Cl.
CPC ......... *B60L 11/1809* (2013.01); *B60L 3/0069* (2013.01); *B60L 3/12* (2013.01);
(Continued)

(58) Field of Classification Search
CPC ................................................... B60L 11/1809
(Continued)

(56) References Cited

U.S. PATENT DOCUMENTS 4,700,300 A * 10/1987 Schultz .................. G01V 5/101
250/256
5,636,620 A * 6/1997 Kiess ...................... F02P 17/12
123/625
(Continued)

FOREIGN PATENT DOCUMENTS

CN       201508392      6/2010
WO    2011 112510      9/2011
(Continued)

OTHER PUBLICATIONS

International Search Report Issued Oct. 16, 2013 in PCT/FR13/051065 Filed May 16, 2013.
(Continued)

*Primary Examiner* — M'Baye Diao
(74) *Attorney, Agent, or Firm* — Oblon, McClelland, Maier & Neustadt, L.L.P.

(57) ABSTRACT

A system and method for secure charging of a motor vehicle battery including the steps of secure charging of the battery of a motor vehicle from a network estimating the resistance between the earth and the neutral of the network, including at least one injection of pulses of current into the network, measurements of voltage between the earth and the neutral of the network in response to each pulse, and a determination of the earth resistance from the measured voltages. Each injection of current pulses into the network includes the (Continued)

Figure 1:
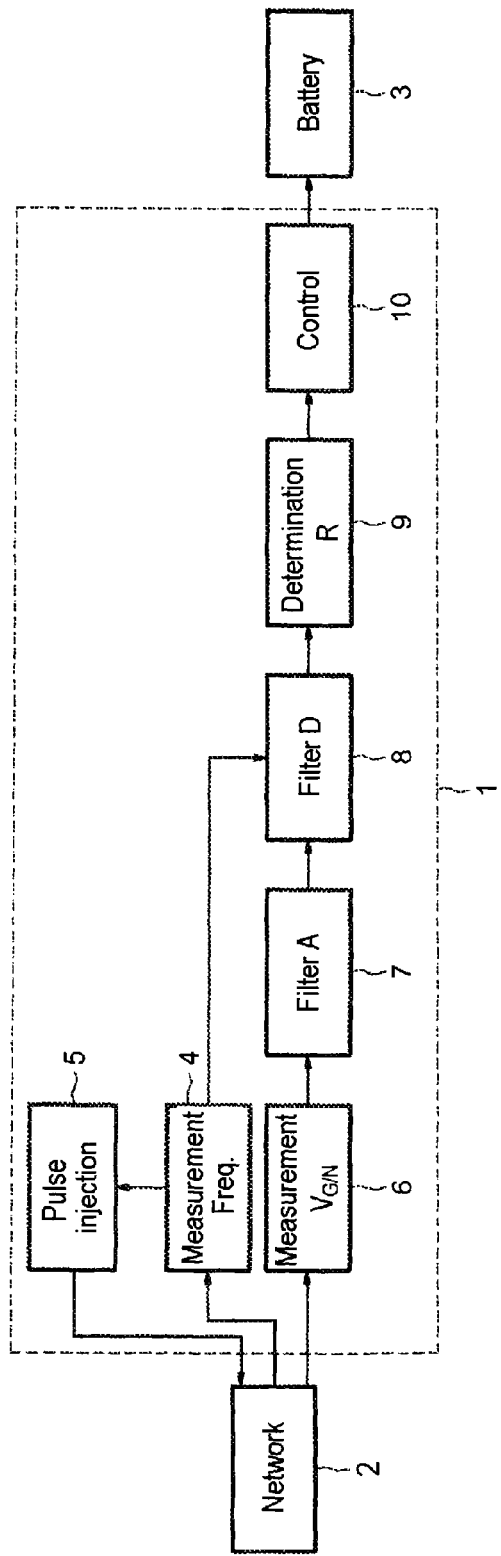

injection of a first positive pulse followed by a second negative pulse, the first and the second pulses having an equal intensity in terms of absolute value and being separated by a sufficiently short interval for a stray capacitor coupled to the network to be further charged during the second pulse.

16 Claims, 4 Drawing Sheets

(51) Int. Cl.
*B60L 3/12* (2006.01)
*B60L 3/00* (2006.01)
*G01R 27/18* (2006.01)

(52) U.S. Cl.
CPC ..... *B60L 11/1816* (2013.01); *B60L 2240/547* (2013.01); *B60L 2240/549* (2013.01); *B60L 2240/80* (2013.01); *G01R 27/18* (2013.01); *Y02T 10/7005* (2013.01); *Y02T 10/7072* (2013.01); *Y02T 90/14* (2013.01)

(58) Field of Classification Search
USPC .......................................................... 320/109
See application file for complete search history.

(56) References Cited

U.S. PATENT DOCUMENTS

2010/0060296 A1* 3/2010 Jiang ..................... G01D 18/00
324/613
2011/0216451 A1 9/2011 Haines et al.
2014/0176163 A1 6/2014 Ripoll et al.

FOREIGN PATENT DOCUMENTS

WO WO 2012/168634 A1 12/2012
WO WO 2013/190207 A1 12/2013

OTHER PUBLICATIONS

French Search Report Issued Feb. 6, 2013 in French Application No. 1254514 Filed May 16, 2012.

* cited by examiner

SYSTEM AND METHOD FOR SECURE CHARGING OF A MOTOR VEHICLE BATTERY

The invention relates to the safety of a user of an on-board device for charging a battery of a motor vehicle, and more particularly to estimation of the quality of the ground of the supply network coupled to the device for charging the battery of the motor vehicle.

During the charging of a battery of an electrical motor vehicle, heavy currents flow through the supply network to the battery of the vehicle. In order to be able to charge the vehicle correctly, these currents are chopped so as to respect the constraints of the supply network.

The chopping of the electric currents leads to the appearance of leakage currents, which need to be discharged via the ground contact of the supply network. This ground contact is connected to the chassis of the vehicle, and therefore offers a path for all the parasitic currents.

In order to ensure charging in full safety, it is necessary to ensure that the connection to ground is of good quality, that is to say the equivalent resistance of the ground path is low compared with the resistance that would be provided by a human touching the chassis of the motor vehicle. Without this connection to ground, a contact current phenomenon may occur. If a person touched the chassis of the vehicle, it would be their body that establishes the connection between the charger and the ground, and it is therefore through them that all the leakage currents, which would be potentially dangerous, would pass, if no control device is added.

A poor-quality ground, that is to say one with a resistance equivalent to that of a human body, also allows some of the leakage currents to pass through the body of the individual. Specifically, if an individual touched the chassis of the vehicle being charged, in this case the leakage current would have two parallel paths with the same resistance, and therefore half the leakage currents could pass through the individual to return to ground.

In order to ensure that no contact current can occur, it is necessary to ensure that the value of the resistance of the connection to ground is less than a certain threshold before charging the battery of the motor vehicle.

In order to be able to estimate the resistance between the ground and the neutral of the supply network, it is possible to inject current pulses directly into the ground path and looping back via the neutral of the network, and to measure the voltage between the neutral and the ground.

In the ideal case, the current injected into the ground is measured, as well as the voltage which is the image of the injected current according to Ohm's law. The value of the resistance is then obtained by dividing the measured voltage by the measured current.

Unfortunately, it is impossible to obtain correct results so simply because the voltage between the neutral and the ground is highly perturbed.

A first part of the perturbations may come from the leakage currents mentioned above. Since these currents also pass through the ground, they will perturb the measurement of the voltage between the neutral and the ground.

Certain data are known about all these perturbations. At low frequency, particularly for frequencies of less than 1 kHz, these perturbations are generated at the harmonics of the supply network, for example 50 Hz, 100 Hz, etc., and have a maximum amplitude of 7 V for the rms voltage and 6.6 mA for the currents. These levels of perturbation are defined by the EDF standards. For higher frequencies, the EDF standards predict perturbation current amplitudes varying continuously between 6.6 mA at 1.5 kHz and 66 mA at 15 kHz, the amplitude of the current remaining at 66 mA up to 150 kHz.

Lastly, a second constraint results from the fact that it is not possible to send an arbitrary current into the ground. Above all, it must not trip the network to which the circuit is connected. It is therefore impossible to send pulses with too high an amplitude and/or too long a duration.

The challenge is therefore to succeed in estimating the ground resistance despite all these sources of error, while respecting the constraints imposed by the need to be able to install the system in a motor vehicle whose processors operate at a maximum frequency of 10 kHz.

A second part of the perturbations, representing a significant part of the perturbations, may come from the charging terminals or another motor vehicle that is being charged, because the components of this other motor vehicle will connect a parasitic capacitance between the ground and the neutral of the supply network, which may vitiate the measurement of the resistance of the ground significantly.

In the case, for example, in which the ground of the network is not connected, the only path of the current is provided by the parasitic capacitance. The current pulses injected into the ground in order to measure the resistance of the ground will then charge the parasitic capacitance.

In a case, for example, in which a charging device is connected to a parasitic capacitance of 1 pF, the injection of a current pulse with an amplitude of 20 mA and a pulse duration of 1 ms will lead to a voltage of about 5 V charging the capacitance, which is equivalent to a resistance of 250 ohms. This fictitious resistance placed in parallel with the true ground resistance will then vitiate the calculation, in particular by reducing the value obtained for the estimated ground resistance. An error in the estimation may be dangerous for the safety of the users.

There are apparatuses on the market which carry out estimation of the resistance of the ground. These apparatuses have a computation power much greater than that available on a motor vehicle, and have too high a cost to envision putting one in each motor vehicle.

However, these apparatuses are not configured with a view to managing the safety of an individual. Specifically, they are only configured to give information about the value of the ground resistance.

Patent Application CN 201 508 392 describes a method for measuring the resistance of the ground, making it possible to eliminate a single frequency in the neutral/ground voltage. However, the perturbations generated by the other harmonics are not eliminated, and still perturb the measurement of the ground/neutral voltage, and consequently the determination of the resistance of the ground.

Patent Application EP 1 482 317 describes a method for injecting current with a very high amplitude so as to improve the signal-to-noise ratio of the ground/neutral voltage measurement. However, the method requires a suitable environment which can withstand the strong current peaks in the ground, and is thus usable only in a workshop in which the circuit breakers tolerate leaks ten to one thousand times greater than the circuit breakers of a domestic network, which generally trip for a current in excess of 33 mA.

Patent Application EP 0 642 027 describes a method based on injecting voltage between the ground and the neutral. However, the use of such a method requires a system with a size much too great to be integrated into a vehicle, and to be able to impose a voltage on the network.

The object of the invention is to provide a system and a method for estimating the resistance of the ground, which is installed in a motor vehicle, by filtering the perturbations due to the supply network and distinguishing the presence of a parasitic capacitance located on the same network.

According to one aspect of the invention, according to one embodiment, a secure system for charging of a battery of a motor vehicle from a supply network is provided. The system is installed in the motor vehicle and comprises means for injecting current pulses into the supply network, and means for measuring the voltage between the ground and the neutral of the supply network.

According to a general characteristic of the invention, the pulse injection means are configured so that each injection of current pulses into the supply network comprises the injection of a positive first pulse followed by a negative second pulse, the first and second pulses having an equal strength in absolute value and being separated by an interval which is sufficiently short for a parasitic capacitance coupled to the supply network to be still charged during the second pulse, and the system comprises means of determining the ground resistance on the basis of the amplitude of the current pulses and voltages measured for the first pulse and the second pulse of each pulse injection.

In the case of the positive first pulse, the capacitance being discharged, the voltage measured at the end of the current pulse will be expressed by the expression:

$$V_1^m = R_t I_{inj} \left(1 - e^{\frac{1}{R_t C_{parasitic}}}\right) \quad (1)$$

in which $V_1^m$ is the voltage measured across the terminals of the vehicle between the neutral and the ground for the first current pulse injected, $I_{inj}$ is the strength of the current pulse injected into the supply network, $R_t$ is the resistance between the neutral and the ground of the supply network, and $C_{parasitic}$ is the parasitic capacitance connected between the neutral and the ground of the supply network.

In the case of the negative second pulse, immediately after the first pulse, the capacitance starting from a charged state, the voltage measured is not exactly the opposite of the previous measurement but, after simplification, will be expressed by the expression:

$$V_2^m = -R_t I_{inj} \left(1 - e^{\frac{1}{R_t C_{parasitic}}}\right)^2 \quad (2)$$

in which $V_2^m$ is the voltage measured across the terminals of the vehicle between the neutral and the ground for the second current pulse injected, $I_{inj}$ is the strength of the current pulse injected into the supply network, $R_t$ is the resistance between the neutral and the ground of the supply network, and $C_{parasitic}$ is the parasitic capacitance connected between the neutral and the ground of the supply network.

Each injection of two consecutive pulses is separated from the previous one by several electrical periods of the supply network.

In order to find the values of the ground resistance and of the possible parasitic capacitance coupled to the supply network, the following formulae may be used:

$$R_t = \left| \frac{V_1^{m2}}{V_2^m I_{inj}} \right| \quad (3)$$

$$C_{parasitic} = -\frac{V_2^m I_{inj}}{V_1^{m2} \log\left(1 - \frac{V_2^m}{V_1^m}\right)} \quad (4)$$

The system may advantageously comprise means for measuring the frequency of the supply network, an analog filter for filtering the measured voltages at high frequencies, a digital filter for filtering the analog-filtered voltages at low frequencies, the determination means using the digitally filtered voltages as measured voltages, and the digital filter comprising an average filter determining an average on the basis of N voltage measurements separated by a time interval $$T + \frac{T}{N},$$

with T being the period of the supply network as determined by the means for measuring the frequency of the supply network.

This makes it possible to filter the perturbations of an imperfect supply network. Thus, for a conventional supply network at 50 Hz and an average taken on the basis of 40 measurements, the average filter will determine an average on the basis of 40 voltage measurements carried out with an interval of 20.5 ms between two measurements.

The high frequencies comprise frequencies of more than 2 kHz, and in particular those at 5 kHz. The low frequencies comprise frequencies of less than 5 kHz, and in particular frequencies of between 50 Hz and 2 kHz.

In the case of a supply network having a frequency of 60 Hz and an average taken on the basis of 40 voltage measurements, the measurements will be spaced apart by a time interval of 17.1 ms, rounding to within 0.1 ms (T=16.7 ms).

Preferably, the analog filter is a second-order analog filter with a cutoff frequency of between 800 Hz and 1.2 kHz, and preferably 1 kHz, and a damping factor of between 0.6 and 0.8, and preferably 0.7, so as to obtain an attenuation of −20 dB at a frequency of 3 kHz.

The selection of an analog filter having such characteristics makes it possible to minimize the duration of the current pulses injected into the supply network in order to carry out the measurements. The reduction in the duration of the current pulses makes it possible to increase the amplitude of the current pulses, and thus improve the signal/noise ratio.

Advantageously, taking into account the passband of the analog filter, so that the measured voltage is indeed the image of the current of the injected pulses, that is to say in order to take into account the response time of the analog filter, the current pulses have a duration at least greater than 0.8 ms, and preferably 1 ms, and a maximum amplitude of between 18 mA and 22 mA, and preferably 20 mA.

The secure on-board system may advantageously comprise safety control means adapted to activate the charging of the battery from the supply network only if the measured ground resistance is less than an activation threshold.

Thus, if the ground of the supply network has a resistance greater than the activation threshold, that is to say a resistance considered to be at least equivalent to the resistance of a human body, the supply network is not coupled to the battery of the vehicle and the charging is not started. This is in order to avoid the risk of the occurrence of a contact current.

To this end, the activation threshold may advantageously correspond to a resistance value of between 20 and 600 ohms, and preferably 200 ohms.

According to another aspect, in one implementation, a method is provided for secure charging of a battery of a motor vehicle from a supply network, estimating the resistance between the ground and the neutral of the supply network, wherein at least one injection of current pulses into the supply network is carried out, measurements of voltage between the ground and the neutral of the supply network in response to each pulse are taken, and the ground resistance is determined on the basis of the voltages measured.

According to a general characteristic of the invention, each injection of current pulses into the supply network comprises the injection of a positive first pulse followed by a negative second pulse, the first and second pulses having an equal strength in absolute value and being separated by an interval which is sufficiently short for a parasitic capacitance coupled to the supply network to be still charged during the second pulse, and the determination of the ground resistance is carried out on the basis of the amplitude of the current pulses and the voltages measured for the first pulse and the second pulse of each pulse injection.

Advantageously, the frequency of the supply network is measured, the voltages measured for each pulse are analog-filtered at high frequencies, the analog-filtered voltages are digitally filtered at low frequencies, and the determination of the ground resistance is carried out on the basis of the digitally filtered voltages, the digital filtering comprising the determination of an average on the basis of N voltage measurements separated by a time interval $$T + \frac{T}{N},$$

with T being the period of the supply network as determined on the basis of the measurement of the frequency of the supply network.

Preferably, the analog filtering comprises second-order filtering with a cutoff frequency of between 800 Hz and 1.2 kHz, and preferably 1 kHz, and a damping factor of between 0.6 and 0.8, and preferably 0.7.

Preferably, the current pulses have a duration at least greater than 0.8 ms, and preferably 1 ms, and a maximum amplitude of between 18 mA and 22 mA, and preferably 20 mA.

Preferably, the duration of the current pulses injected into the supply network corresponds at least to the period of the supply network.

Advantageously, N=40 measurements of voltage between the ground and the neutral may be carried out in order to eliminate the first 39 harmonics of the supply network.

Preferably, the supply network is coupled to the battery only if the measured ground resistance is less than an activation threshold.

Figure 2:
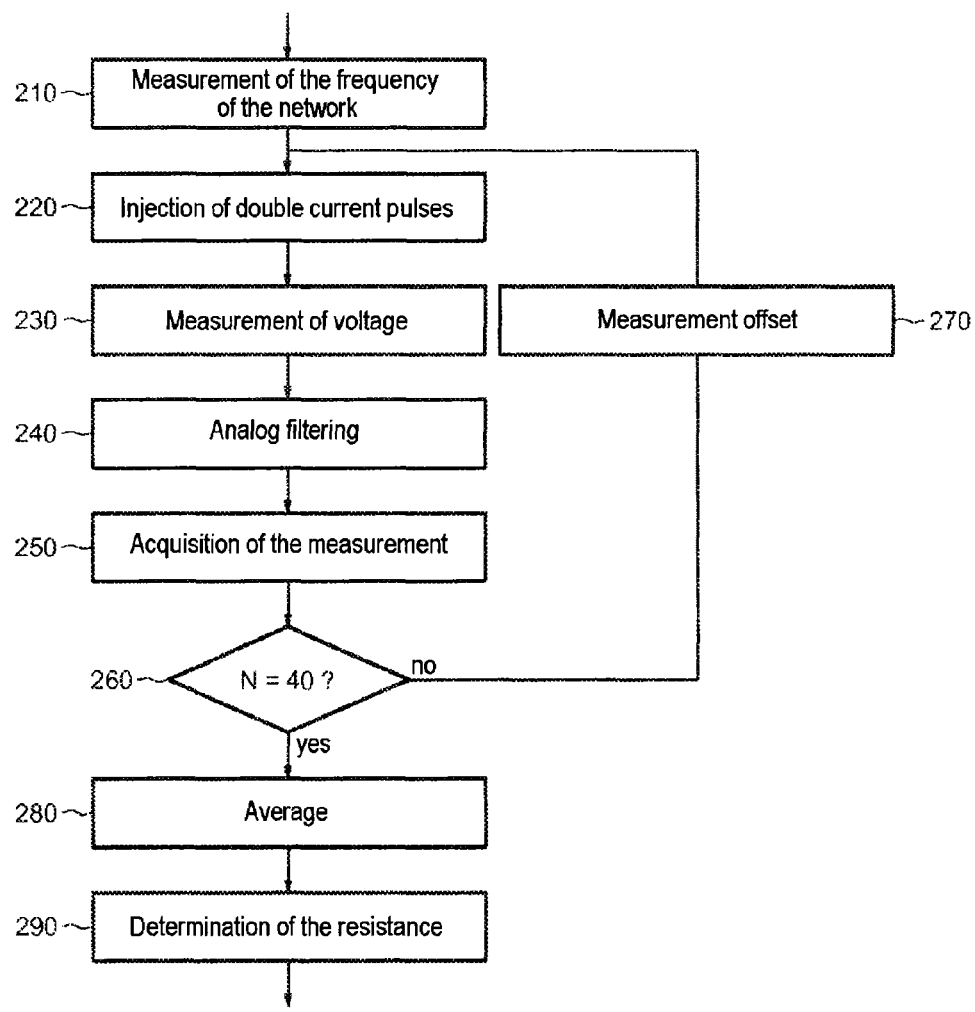
Figure 3:
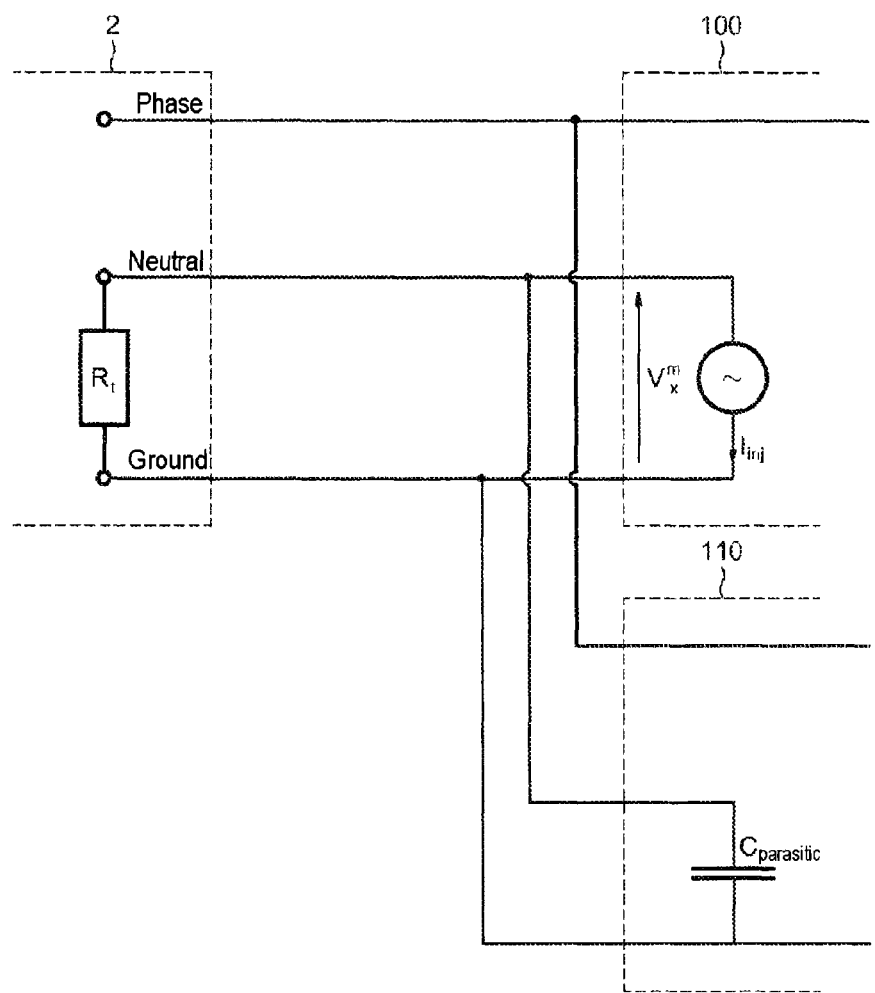
Figure 4:
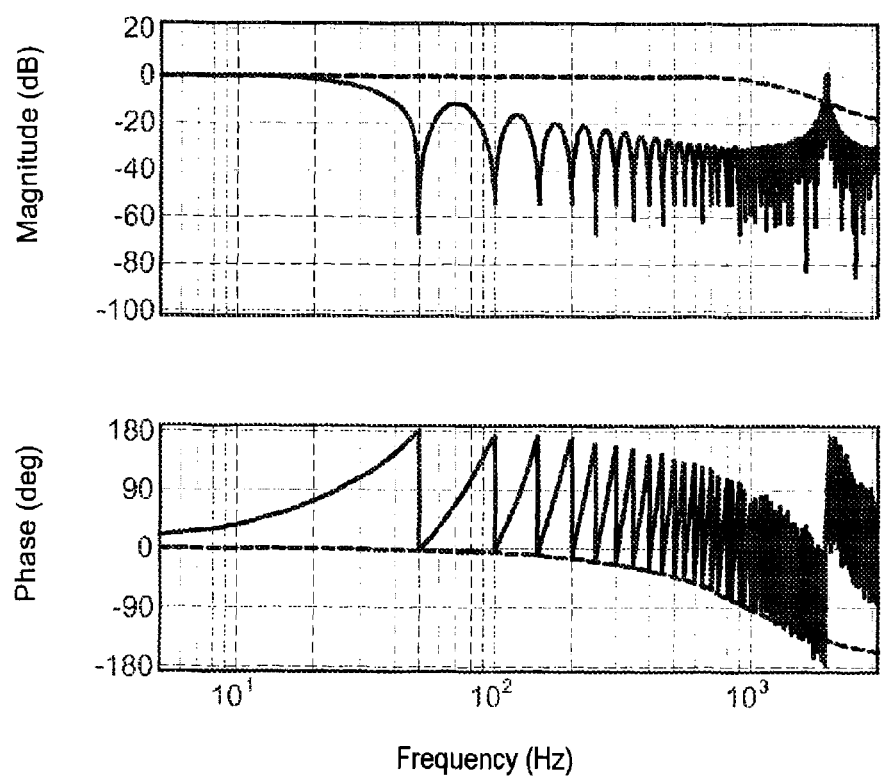

Other advantages and characteristics of the invention will become apparent on studying the detailed description of an embodiment and an implementation thereof, which are entirely nonlimiting, and the appended drawings, in which:

FIG. 1 schematically presents a secure on-board system for charging a battery of a motor vehicle according to one embodiment;

FIG. 2 presents a flowchart of a method for estimating the ground resistance of a supply network according to one implementation;

FIG. 3 presents an electrical diagram of the voltages involved in the supply network;

FIG. 4 represents two Bode diagrams, in amplitude and phase, illustrating the actions of the two filters of the system of FIG. 1.

FIG. 1 represents a secure system 1 according to one embodiment of the invention. The secure system 1 is installed in a motor vehicle, and is intended to be coupled between a supply network 2 and a battery 3 of the motor vehicle, during the charging of the battery.

The system 1 comprises means 4 for measuring the frequency of the supply network 2, as well as means 5 for injecting current pulses into the supply network 2. The frequency measurement means 4 are coupled to the current pulse injection means 5, so as to deliver the value of the frequency of the supply network 2 to the current pulse injection means 5.

The current pulse injection means 5 adjust the minimum duration of the pulses to the period T of the signal of the supply network 2. In the case of a supply network 2 at 50 Hz, the minimum duration of the current pulses will be 1 ms. At each injection, the pulse means 5 deliver a positive first pulse followed immediately after by a negative second pulse. The two successive pulses have the same amplitude in absolute value, but are of opposite sign.

This double pulse of opposite signs makes it possible, during the determination of the ground resistance, to overcome the value of the possible parasitic capacitance coupled to the supply network 2, which may vitiate the value of the ground resistance.

The system 1 also comprises means 6 for measuring the voltage between the ground and the neutral of the supply network 2, which carry out a voltage measurement in response to each current pulse injected onto the ground and looping back via the neutral of the supply network 2.

The voltage measurements carried out at the end of the first and second successive pulses give strictly opposite values when there is no parasitic capacitance coupled to the supply network 2.

When there is a parasitic capacitance, this capacitance, discharged before the first pulse, is charged during this first pulse and does not have the time to discharge before the second current pulse of opposite sign. The two voltage measurements resulting from the two successive current pulses therefore differ, and are expressed by equations (1) and (2) above.

In order to find the values of the ground resistance and of the possible parasitic capacitance coupled to the supply network, formulae (3) and (4) are applied, using the voltage measurements of the first and second pulses of an injection.

Each injection of a first and second injection is separated from the previous one by a plurality of electrical periods of the supply network 2.

The processors of a motor vehicle operate at a maximum frequency of 10 kHz. It is known from Shannon's theorem that it will be entirely impossible to filter the perturbations due to frequencies of more than 5 kHz with the aid of a digital filter. In order to overcome the high-frequency perturbations in the voltage measurements, the system 1 comprises an analog filter 7 coupled to the output of the voltage measurement means 6.

The analog filter 7 used in this embodiment is a second-order analog filter with a cutoff frequency at 1 kHz and a damping factor of 0.7, in order to obtain attenuation of −20 dB at 3 kHz. It is preferable to use a filter having such characteristics rather than an arbitrary analog filter, because it makes it possible to minimize the duration of the current pulses injected, and thus makes it possible to increase the amplitude of the current pulses injected.

The system 1 comprises a digital filter 8 coupled to the output of the analog filter 7. The digital filter 8 makes it possible to eliminate the perturbations due to the harmonics of the supply network 2 between 50 Hz and 2 kHz. Above 2 kHz, the analog filter already attenuates the perturbations sufficiently.

Taking into account the passband of the analog filter, so that the voltage measured is indeed the image of the current of the injected pulses, it is preferable for the minimum duration of the current pulses injected to correspond at least to the response time of the analog filter, so that the high-frequency filtering is effective. To this end, the duration of the pulses injected should at least correspond to one period of the signal of the supply network 2. Thus, for a supply network 3 with a frequency of 50 Hz, the minimum duration of the current pulses injected should be 1 ms.

A longer current pulse duration would make it necessary to reduce the amplitude of the current pulses so as not to trip the system. However, it is important to emit pulses with an amplitude that is as high as possible, because they generate in response voltages which are higher and therefore more visible relative to the noise.

In the case of a supply network 2 at 50 Hz, for a pulse of 1 ms, the amplitude of the current pulses may be up to at most 20 mA without there being a risk that the system trips. A pulse of 20 mA on a resistance of 50 ohms will generate a voltage of 1 V embedded in noise of 50 V (sums of the noises at the harmonics of the supply network). Numerically, it is therefore necessary to eliminate the harmonics of the supply network 2 as far as possible.

In order to do this, the digital filter 8 comprises an average filter, which has the advantage of infinitely attenuating the targeted frequencies. For example, recording two points separated by 10 ms and taking the average makes it possible to fully eliminate the 50 Hz.

The digital filter is coupled to the means 4 for measuring the frequency of the supply network 2, in order to receive the information relating to the electrical period T of the supply network 2.

By recording forty measurement points distributed equally over the 20 ms of the electrical period, each measurement point comprising one voltage measurement for the first pulse and one voltage measurement for the second pulse, it is possible to eliminate up to the $39^{th}$ harmonic of the network, i.e. up to the frequency of 1950 Hz on a supply network 2 operating at 50 Hz.

However, carrying out injections of two successive pulses of 1 ms each, each double pulse being separated from the previous one by 500 µs, is impossible with a pulse amplitude of 20 mA.

Here, injection of a first pulse immediately followed by a second pulse of opposite sign is referred to by the expression "double pulse".

In order nevertheless to take this average, the system carries out double-pulse measurements while offsetting each new double-pulse measurement by one electrical period T of the signal of the supply network 2, in addition to the measurement offset d equal to d=T/N, with N being the number of measurements to be carried out in one electrical signal period T.

Thus, in the case of a supply network at 50 Hz and an average taken on the basis of 40 measurements, the first double voltage measurement in response to a first double pulse would be carried out at a time t=0, and the second double voltage measurement in response to a second double pulse would be carried out at a subsequent time t=20.5 ms, the interval corresponding to the addition of an electrical period T=1/50=20 ms and a measurement offset d=20/40=0.5 ms. This second double measurement would be identical to a double measurement carried out only 500 µs after the first, since the noise signal is periodic with a period T=20 ms.

By thus carrying out forty acquisitions of double voltage measurements separated by 20.5 ms, and taking the average of the first voltages measured for each double pulse (positive average), on the one hand, and the average of the second voltages measured for each double pulse (negative average), on the other hand, over these forty double measurements, the digital filter 8 eliminates the perturbations at the harmonics of the network and makes it possible to find the DC component due to the current pulses injected into the supply network 2.

The average voltage digitally filtered in this way is delivered to the means 9 for determining the resistance $R_t$ between the ground and the neutral of the supply network 2. The value of the resistance of the ground is determined on the basis of the absolute value of the ratio between the square of said average of the first voltages and the product of said average of the second voltages by the amplitude of the current pulses injected into the supply network 2.

The system 1 comprises security control means 10 coupled at the input to the determination means 9 and at their output to the battery 3 of the motor vehicle. If the value of the ground resistance determined is less than a threshold value of 500 ohms, the coupling to the battery 3 of the motor vehicle is carried out, and the charging can start. If not, the battery 3 is not electrically coupled to the supply network 2, and the charging does not take place.

FIG. 2 presents a flowchart of a method for estimating the resistance between the ground and the neutral of a supply network used for charging a battery of a motor vehicle, according to one implementation.

In a first step 210, the frequency of the supply network 2 coupled to the motor vehicle 100 for recharging the battery 3 of the motor vehicle is measured.

In a subsequent step 220, double current pulses are injected into the supply network 2, each double pulse comprising a first current pulse followed by a second current pulse of opposite sign. The duration of the pulses depends on the analog filter 7 selected, which itself depends on the period of the supply network 2.

Then, in a step 230, measurements of voltage $V_x^m$ between the ground, Ground, and the neutral, Neutral, of the supply network 2 are carried out at the end of each of the first and second current pulses injected.

FIG. 3 presents an electrical diagram of the voltages involved in the supply network.

In a subsequent step 240, each measured voltage $V_x^m$ is analog-filtered at high frequencies.

The measurement $V_x^m$ is subsequently acquired in a step 250, then the number of measurements $V_x^m$ carried out is tested in a step 260. If 40 double voltage measurements have not yet been carried out, a double measurement is restarted on the basis of a new double current pulse injection in step 220 over a subsequent electrical period T, having offset in a step 270 the instant of the double measurement by an offset time d=T/N, i.e. in the case of a supply network at 50 Hz, a time d 0.5 ms.

Once the $40^{th}$ double measurement has been carried out, low-frequency digital filtering is carried out in a subsequent step 280 by taking the average of the forty first measured voltages $V_1^m$, on the one hand, and the average of the forty second measured voltages $V_2^m$, on the other hand, and the resistance $R_t$ between the ground, Ground, and the neutral, Neutral, is finally determined in a step 290 on the basis of the absolute value of the ratio between the square of said average of the first voltages and the product of said average of the second voltages by the amplitude of the current pulses according to expression (3). This determination makes it possible to overcome the value of the parasitic capacitance $C_{parasitic}$ coupled between the ground, Ground, and the neutral, Neutral, of the supply network 2 via the coupling of another motor vehicle 110 to the supply network 110.

FIG. 4 presents, on two Bode diagrams, the amplitude and the phase of the actions of the analog filter in dashes and of the digital filter in a solid line for a supply network frequency of 50 Hz.

The secure system 1 is adapted to the constraints of the motor vehicle and makes it possible to check the quality of the ground of a network, in particular a domestic network, before authorizing the start of the charging of the battery of the motor vehicle in which the secure system is installed, and to do so even if a perturbing element, such as another charger, introduces capacitive elements into the supply network.

The invention claimed is:

1. A secure system for charging of a battery of a motor vehicle from a supply network, the system being installed in the motor vehicle and comprising:
   means for injecting current pulses into the supply network; and
   means for measuring a voltage between a ground and a neutral of the supply network,
   wherein the pulse injection means are configured so that each injection of current pulses into the supply network comprises the injection of a positive first pulse followed by a negative second pulse, the first and second pulses having an equal strength in absolute value and being separated by an interval which is sufficiently short for a parasitic capacitance coupled to the supply network to be still charged during the second pulse, and the system comprises means of determining the ground resistance on the basis of the amplitude of the current pulses and voltages measured for the first pulse and the second pulse of each pulse injection.

2. The system as claimed in claim 1, further comprising:
   means for measuring the frequency of the supply network;
   an analog filter for filtering the measured voltages at high frequencies; and
   a digital filter for filtering the analog-filtered voltages at low frequencies, the determination means using the digitally filtered voltages as measured voltages, and the digital filter comprising an average filter determining an average on the basis of N voltage measurements separated by a time interval $$T + \frac{T}{N},$$

with T being the period of the supply network as determined by the means for measuring the frequency of the supply network and with N being an integer.

3. The system as claimed in claim 2, wherein the analog filter is a second-order analog filter with a cutoff frequency of between 800 Hz and 1.2 kHz, and a damping factor of between 0.6 and 0.8.

4. The system as claimed in claim 3, wherein the cutoff frequency is 1 kHz and the damping factor is 0.7.

5. The system as claimed in claim 3, wherein the current pulses have a duration at least greater than 0.8 ms, and a maximum amplitude of between 18 mA and 22 mA.

6. The system as claimed in claim 5, wherein the duration of the current pulses is 1 ms and the maximum amplitude is 20 mA.

7. The system as claimed in claim 1, further comprising:
   safety control means adapted to activate the charging of the battery from the supply network only if the measured ground resistance is less than an activation threshold.

8. The system as claimed in claim 7, wherein the activation threshold corresponds to a resistance value of between 20 and 600 ohms, and preferably corresponds to 200 ohms.

9. A method for secure charging of a battery of a motor vehicle from a supply network, comprising:
   estimating a resistance between a ground and a neutral of the supply network;
   injecting, at least once, current pulses into the supply network;
   taking measurements of voltage between the ground and the neutral of the supply network in response to each pulse; and
   determining the ground resistance on the basis of the voltages measured,
   wherein each injection of current pulses into the supply network comprises the injection of a positive first pulse followed by a negative second pulse, the first and second pulses having an equal strength in absolute value and being separated by an interval which is sufficiently short for a parasitic capacitance coupled to the supply network to be still charged during the second pulse, and the determination of the ground resistance is carried out on the basis of the amplitude of the current pulses and the voltages measured for the first pulse and the second pulse of each pulse injection.

10. The method as claimed in claim 9, wherein the frequency of the supply network is measured, the voltages measured for each pulse are analog-filtered at high frequencies, the analog-filtered voltages are digitally filtered at low frequencies, and the determination of the ground resistance is carried out on the basis of the digitally filtered voltages, the digital filtering comprising the determination of an average on the basis of N voltage measurements separated by a time interval $$T + \frac{T}{N},$$

with T being the period of the supply network as determined on the basis of the measurement of the frequency of the supply network and N is an integer.

11. The method as claimed in claim 10, wherein the analog filtering comprises second-order filtering with a cutoff frequency of between 800 Hz and 1.2 kHz, and a damping factor of between 0.6 and 0.8.

12. The method as claimed in claim 11, wherein the cutoff frequency is 1 kHz, and the damping factor is 0.7.

13. The method as claimed in claim 11, wherein the current pulses have a duration at least greater than 0.8 ms, and a maximum amplitude of between 18 mA and 22 mA.

14. The method as claimed in claim 13, wherein the duration of the current pulses is 1 ms, and the maximum amplitude is 20 mA.

15. The method as claimed in claim 9, wherein the duration of the current pulses injected into the supply network corresponds at least to the period of the supply network.

16. The method as claimed in claim 9, wherein the supply network is coupled to the battery only if the measured ground resistance is less than an activation threshold.

* * * * *